(12) United States Patent
von Koblinski et al.

(10) Patent No.: US 8,102,045 B2
(45) Date of Patent: Jan. 24, 2012

(54) INTEGRATED CIRCUIT WITH GALVANICALLY BONDED HEAT SINK

(75) Inventors: Carsten von Koblinski, Villach (AT); Friedrich Kroner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 303 days.

(21) Appl. No.: 11/835,781

(22) Filed: Aug. 8, 2007

(65) Prior Publication Data

US 2009/0039501 A1  Feb. 12, 2009

(51) Int. Cl.
*H01L 23/34* (2006.01)

(52) U.S. Cl. .................. 257/713; 257/737; 257/E23.02; 156/275.3

(58) Field of Classification Search .................. 29/580; 257/675, 686, 712, 718, E23.101, 706, 707, 257/713, 719, 720, 737, E23.02, E23.023, 257/E23.087; 156/275.3
See application file for complete search history.

(56) References Cited

U.S. PATENT DOCUMENTS

| | | | |
|---|---|---|---|
| 4,064,620 A * | 12/1977 | Lee et al. ................... | 438/122 |
| 5,689,138 A | 11/1997 | Dekker et al. | |
| 5,851,337 A * | 12/1998 | Chen .......................... | 156/275.3 |
| 5,930,117 A | 7/1999 | Gengel | |
| 6,210,479 B1 | 4/2001 | Bojarczuk | |
| 6,377,460 B1 | 4/2002 | Pohl et al. | |
| 6,431,259 B2 | 8/2002 | Hellbruck et al. | |
| 6,448,102 B1 | 9/2002 | Kneissl et al. | |
| 6,562,648 B1 | 5/2003 | Wong et al. | |
| 6,599,779 B2 | 7/2003 | Shim et al. | |
| 6,627,921 B2 | 9/2003 | Wong et al. | |
| 6,755,242 B2 * | 6/2004 | White ......................... | 165/80.3 |
| 7,202,107 B2 | 4/2007 | Fuergut et al. | |
| 2003/0064535 A1 | 4/2003 | Kub et al. | |
| 2003/0201525 A1 * | 10/2003 | James et al. ................. | 257/686 |
| 2004/0056346 A1 * | 3/2004 | Palm et al. ................... | 257/706 |
| 2004/0080028 A1 * | 4/2004 | Yanagisawa .................. | 257/675 |
| 2006/0131736 A1 * | 6/2006 | Jansman et al. .............. | 257/712 |
| 2006/0145335 A1 * | 7/2006 | Teshima et al. .............. | 257/718 |
| 2006/0266718 A1 | 11/2006 | Tischner et al. | |
| 2006/0273467 A1 | 12/2006 | Brandenburg et al. | |
| 2007/0076390 A1 | 4/2007 | Kroener et al. | |
| 2007/0152331 A1 * | 7/2007 | Kang et al. ................... | 257/737 |
| 2007/0170586 A1 * | 7/2007 | Lee et al. ..................... | 257/737 |

FOREIGN PATENT DOCUMENTS

| | | |
|---|---|---|
| DE | 19532343 A1 | 3/1996 |
| EP | 1326290 | 7/2003 |
| JP | 02164055 A | 6/1990 |
| JP | 08148531 A | 7/1996 |
| WO | WO 2005/029572 A1 | 3/2005 |

* cited by examiner

*Primary Examiner* — Matthew E Warren
*Assistant Examiner* — Fang-Xing Jiang
(74) *Attorney, Agent, or Firm* — Dicke, Billig & Czaja, PLLC

(57) ABSTRACT

An integrated circuit includes a semiconductor substrate, a first electrical contact formed on the semiconductor substrate, and a first heat sink element bonded to the first electrical contact via a galvanic bond.

15 Claims, 3 Drawing Sheets

INTEGRATED CIRCUIT WITH GALVANICALLY BONDED HEAT SINK

BACKGROUND

For some electronic components, and in particular some integrated circuits (ICs), it is advantageous to restrict the total thickness of the integrated circuits or semiconductor circuits to, for example, a few micrometers. Such thin semiconductor circuits or semiconductor chips have a very small mass and a very small structural height, so they are of importance for many fields of application.

Such thin semiconductor circuits may be produced, for example, by grinding semiconductor wafers of a normal initial thickness of approximately 500 to 1000 micrometers, until the wafers are thinned to the desired thickness. A problem in producing thin semiconductor wafers and circuits is that the thinned wafers and circuits are more susceptible to fractures.

Some semiconductor chips are mounted on a carrier on one side of the chip and, on the other side, are electrically connected by means of bonding wires to other semiconductor chips or to external connections. The advancing miniaturization of semiconductor chips means that the current density in the semiconductor chips rises with the chip area remaining the same, which makes it more difficult to achieve sufficient dissipation of heat from the semiconductor chips. In particular, the side of a semiconductor chip that is contact-connected with bonding wires typically makes no significant contribution to the heat dissipation from the chip.

SUMMARY

One embodiment provides an integrated circuit including a semiconductor substrate. A first electrical contact is formed on the semiconductor substrate. A first heat sink element is bonded to the first electrical contact via a galvanic bond.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
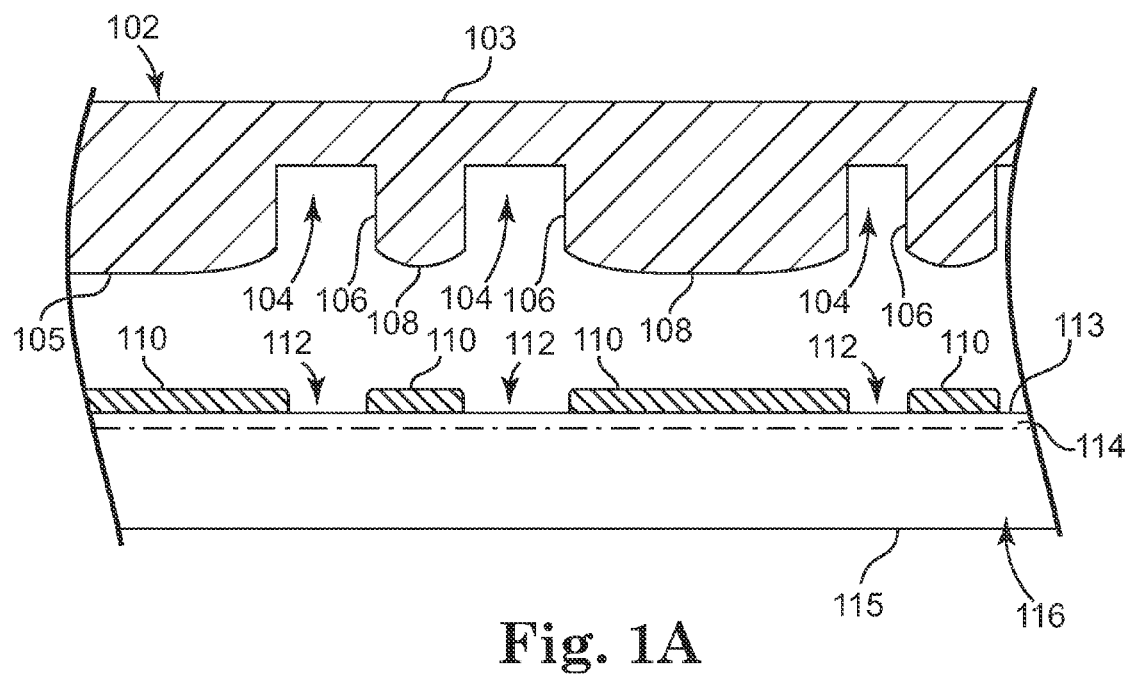
FIG. 1A is a diagram illustrating a cross-sectional view of a semiconductor substrate and a heat sink according to one embodiment.

FIG. 1A is a diagram illustrating a cross-sectional view of a semiconductor substrate 116 and a metal heat sink 102 according to one embodiment. Heat sink 102 includes a top surface 103 and a bottom surface 105. The top surface 103 of heat sink 102 is substantially smooth, while the bottom surface 105 is structured. The bottom surface 105 of heat sink 102 includes a plurality of cavities 104 that extend into the heat sink 102, and a plurality of protrusions 106 that extend away from the heat sink 102. Each of the protrusions 106 includes a curved or bowed surface 108 that curves outward or away from the heat sink 102 (i.e., a convex surface). In one embodiment, the structure on the bottom surface 105 of heat sink 102 is formed by pressing the heat sink 102 into a high-strength metallic matrix having the desired structure. In another embodiment, the structure on the bottom surface 105 of heat sink 102 is formed using chemical etching.

The semiconductor substrate 116 includes a top surface 113 and a bottom surface 115. A plurality of electrical contacts 110 are formed on the top surface 113 of the substrate 116, and are separated by gaps 112. An n+ buried layer 114 is formed in the substrate 116 near the top surface 113. The contacts 110 are electrically coupled to the n+ buried layer 114. In one embodiment, heat sink 102 is a metallurgically manufactured copper (Cu) plate, semiconductor substrate 116 is a silicon (Si) substrate, and contacts 110 are copper (Cu) contacts. In one embodiment, heat sink 102 and semiconductor substrate 116 are each about 500 µm thick. In other embodiments, heat sink 102 and semiconductor substrate 116 are thicker or thinner than 500 µm thick.

In one embodiment, semiconductor substrate 116 is a semiconductor wafer, such as a silicon wafer. In another embodiment, semiconductor substrate 116 is a semiconductor die or chip. In one embodiment, semiconductor substrate 116 is a silicon wafer that comprises a plurality of vertical power transistors, with each vertical power transistor including two electrical contacts 110 on the top surface 113 for gate and source contacts of the transistor, and one electrical contact (not shown in FIG. 1A) on the bottom surface of the substrate 116. In another embodiment, semiconductor substrate 116 includes other types of devices, such as vertical diodes or other types of devices.

Figure 1B:
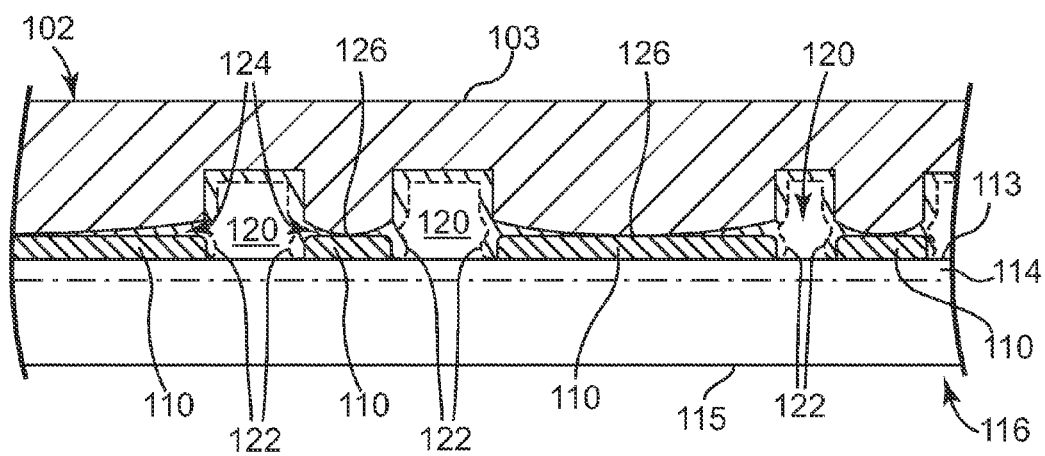
FIG. 1B is a diagram illustrating a cross-sectional view of the semiconductor substrate and the heat sink shown in FIG. 1A after attachment of the heat sink to the semiconductor substrate according to one embodiment.

FIG. 1B is a diagram illustrating a cross-sectional view of the semiconductor substrate 116 and the heat sink 102 shown in FIG. 1A after attachment of the heat sink 102 to the semiconductor substrate 116 according to one embodiment. Heat sink 102 and semiconductor substrate 116 are brought together until the protrusions 106 of the heat sink 102 are in contact with the contacts 110 of the substrate 116. In one embodiment, each of the protrusions 106 in heat sink 102 is aligned with, and has substantially the same length and width dimensions as, a corresponding one of the contacts 110, and each of the cavities 104 in heat sink 102 is aligned with, and has substantially the same length and width dimensions as, a corresponding one of the gaps 112. Thus, in the illustrated embodiment, the structure of the bottom surface 105 of heat sink 102 is essentially a mirror image of the top surface 113 of the substrate 116. After being brought together as shown in FIG. 1B, cavities 120 are formed between the heat sink 102 and the substrate 116.

Since the protrusions 106 include a bowed surface 108 in the illustrated embodiment, each protrusion 106 comes in contact with a corresponding one of the contacts 110 at a single point or location 126 near the center of the contact 110. The bowed surface 108 results in gaps 124 between the protrusions 106 and the contacts 110, with the gaps 124 becoming increasingly larger with further distance from the points of contact 126.

In one embodiment, heat sink 102 is attached to semiconductor substrate 116 using a galvanic process that is performed at or near room temperature. A galvanic process according to one embodiment involves the use of electrolysis to cover an electrically-conducting surface with a metal layer. A galvanic process may also be used to etch or remove material from a surface. During the galvanic process, a copper electrolyte solution (Cu++) is pumped into the cavities 120, and an electrical current is applied. The heat sink 102 acts as the cathode for the galvanic process. As a result of the galvanic process, a copper attachment layer 122 is formed between the heat sink 102 and the substrate 116, which bonds the heat sink 102 and the substrate 116 together, and galvanizes the gaps 124 closed. In one embodiment, after the heat sink 102 and substrate 116 are galvanically bonded together, the cavities 120 are filled with a dielectric material 130 (see FIG. 1C), such as a thermosetting material. In one embodiment, the thermosetting material 130 is an epoxy. After attachment to substrate 116, the heat sink 102 provides stability to the substrate 116 for handling and further processing steps.

Figure 1C:
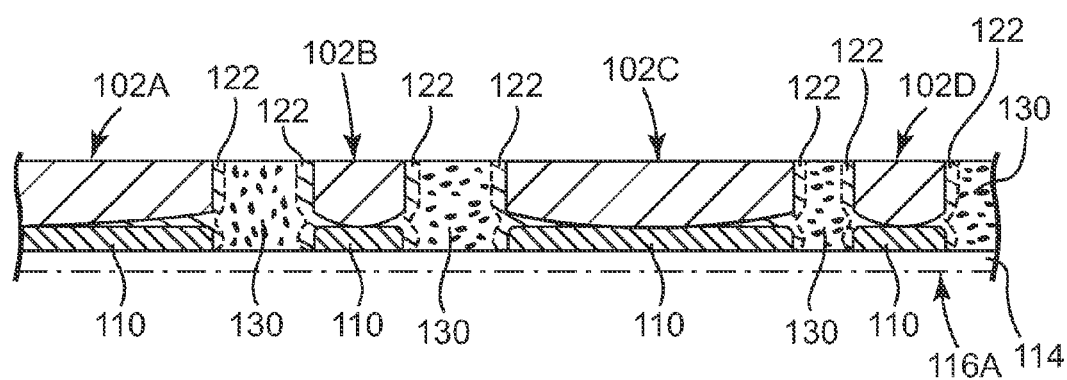
FIG. 1C is a diagram illustrating a cross-sectional view of the semiconductor substrate and the heat sink shown in FIG. 1B after thinning of the heat sink and the semiconductor substrate according to one embodiment.

FIG. 1C is a diagram illustrating a cross-sectional view of the semiconductor substrate 116 and the heat sink 102 shown in FIG. 1B after thinning of the heat sink 102 and the semiconductor substrate 116 according to one embodiment. In one embodiment, the heat sink 102 is thinned first, followed by thinning of the semiconductor substrate 116.

The top 103 of the heat sink 102 is thinned by grinding and etching to provide a plurality of thinned heat sink elements 102A-102D. In one embodiment, the top 103 of the heat sink 102 is thinned at least until the top of the dielectric elements 130 is reached, thereby dividing the single heat sink 102 into a plurality of separate and distinct metal heat sink elements 102A-102D. In one embodiment, each of the heat sink elements 102A-102D is about 250 μm thick. In other embodiments, the heat sink elements 102A-102D are thicker or thinner than 250 μm thick.

In one embodiment, the bottom 115 of the semiconductor substrate 116 is thinned by light-induced anodized silicon etching to provide a thinned semiconductor substrate 116A. In one embodiment, the bottom 115 of the substrate 116 is thinned until the bottom of the n+ buried layer 114 is reached. In one embodiment, the thinned semiconductor substrate 116A is less than or equal to about 10 μm thick. In another embodiment, the thinned semiconductor substrate 116A is less than or equal to about 50 μm thick. In another embodiment, the thinned semiconductor substrate 116A is greater than about 10 μm thick.

In one embodiment, solder balls, bond wires, or other interconnection structures are then applied to heat sink elements 102A-102D. In the embodiment in which substrate 116 is a silicon wafer, individual dies within the wafer are then singulated.

The heat sink elements 102A-102D and the dielectric elements 130 provide support for the substrate 116 during thinning of the substrate 116, and act as a carrier for the thinned substrate 116A. In one embodiment, the heat sink elements 102A-102D have a high electrical conductivity and a good thermal conductivity, and thus act as effective electrical contacts as well as effective heat sinks for dissipating heat from the semiconductor substrate 116. The galvanic process of connecting the electrical contacts 110 and the heat sink elements 102A-102D results in a good electrical contact between these elements. The curved surfaces 108 of the protrusions 106 facilitate a good electrical connection by growing the copper layer 122 from the center point 126 outward, thereby helping to prevent any electrolyte solution from being trapped in a cavity between the protrusions 106 and the contacts 110.

Figure 2A:
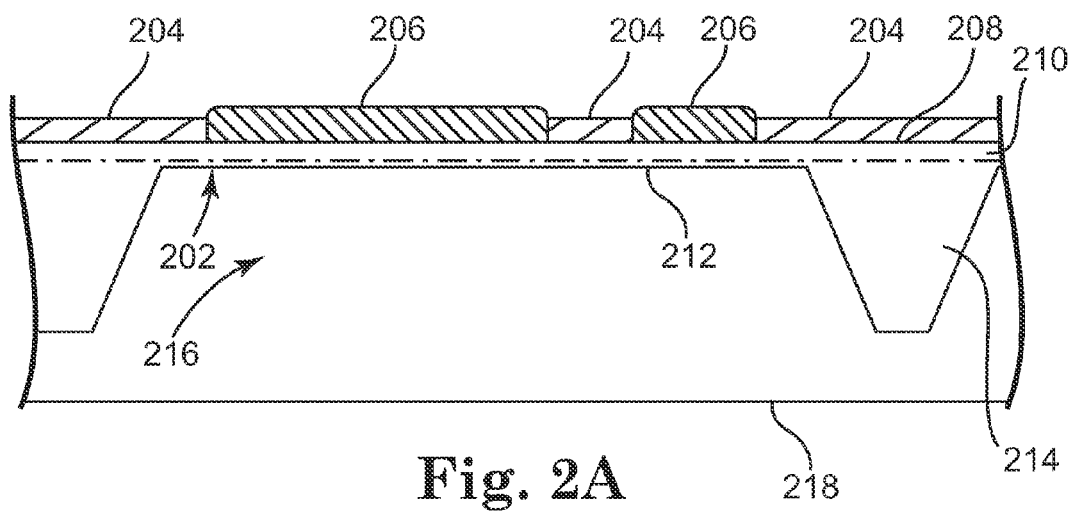
FIG. 2A is a diagram illustrating a cross-sectional view of a semiconductor substrate according to one embodiment.

FIG. 2A is a diagram illustrating a cross-sectional view of a semiconductor substrate 202 according to one embodiment. The substrate 202 includes a top surface 208 and a bottom surface 212. The top surface 208 of the substrate 202 is substantially even or smooth, while the bottom surface 212 is structured. The bottom surface 212 of substrate 202 includes a cavity 216 that extends into the substrate 202, and a plurality of protrusions 214 that extend away from the substrate 202.

A plurality of electrical contacts 206 are formed on the top surface 208 of the substrate 202. A plurality of passivation layer elements 204 are also formed on the top surface 208 of the substrate 202, and surround the electrical contacts 206. In one embodiment, the passivation layer elements 204 are photoimide. An n+ buried layer 210 is formed in the substrate 202 near the top surface 208. The contacts 206 are electrically coupled to the n+ buried layer 210.

A portion of the bottom surface 208 of the substrate 202 has been removed to form the cavity 216, which is defined by the protrusions 214. In one embodiment, the desired portion of the bottom surface 208 is removed by electro-chemical thinning until the bottom of the buried layer 210 is reached. In one embodiment, the contacts 206 are used as the anode, and a contact plate 218 is used as the cathode during the thinning process. An alkaline material such as potassium hydroxide (KOH), or light-induced etching with fluorine ions (F−), is used to selectively remove the substrate material. The protrusions 214 are not subject to the thinning process in one embodiment, and remain to enhance the structural stability of the substrate 202. In one embodiment, the thinned portion of the substrate 202 is less than or equal to about 10 μm thick.

Figure 2B:
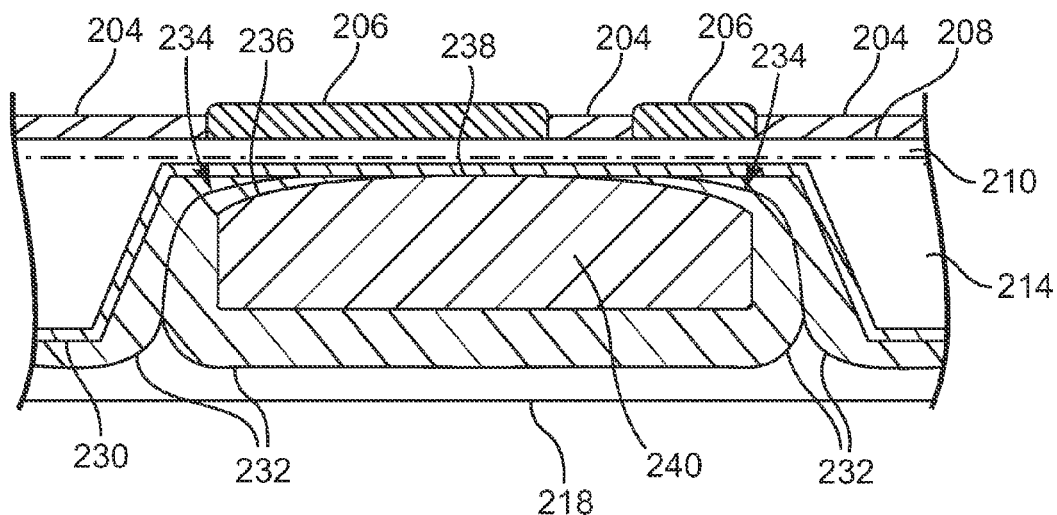
FIG. 2B is a diagram illustrating a cross-sectional view of the semiconductor substrate shown in FIG. 2A after attachment of a heat sink according to one embodiment.

FIG. 2B is a diagram illustrating a cross-sectional view of the semiconductor substrate 202 shown in FIG. 2A after attachment of a metal heat sink element 240 according to one embodiment. In the illustrated embodiment, the heat sink element 240 is attached to the substrate 202 via a seed layer 230 using a galvanic process that is performed at or near room temperature. The seed layer 230 is deposited on the bottom surface 212 of the substrate 202. In one embodiment, the seed layer 230 is a multi-layer Ni/Cu structure. In one embodiment, seed layer 130 acts as an electrical contact on the bottom surface of the substrate 202.

In one embodiment, heat sink element 240 is a metallurgical manufactured copper (Cu) element, semiconductor substrate 202 is a silicon (Si) substrate, and contacts 206 are copper (Cu) contacts. In one embodiment, heat sink element 240 and semiconductor substrate 202 are each about 500 μm thick (prior to thinning of the semiconductor substrate 202).

In one embodiment, semiconductor substrate 202 is a semiconductor wafer, such as a silicon wafer. In another embodiment, semiconductor substrate 202 is a semiconductor die or chip. In one embodiment, semiconductor substrate 202 is a silicon wafer that comprises a plurality of vertical power transistors, with each vertical power transistor including two electrical contacts 206 on the top surface 208 for gate and source contacts of the transistor, and one electrical contact on the bottom surface of the substrate 202. In this embodiment, heat sink element 240 acts as a drain electrical contact. In another embodiment, semiconductor substrate 202 includes other types of devices, such as vertical diodes or other types of devices.

The heat sink element 240 includes a curved or bowed surface 236 that curves outward or away from the element 240 (i.e., a convex surface). Heat sink element 240 and semiconductor substrate 202 are brought together until the bowed surface 236 of the heat sink element contacts the seed layer 230. Since the heat sink element 240 has a bowed surface 236 in the illustrated embodiment, the heat sink element 240 comes in contact with the seed layer 230 at a single point or location 238. The bowed surface 236 results in gaps 234 between the heat sink element 240 and the seed layer 230, with the gaps 234 becoming increasingly larger with further distance from the point of contact 238.

In one embodiment, heat sink element 240 is attached to seed layer 230 using a galvanic process that is performed at or near room temperature. During the galvanic process, a copper electrolyte solution (Cu++) is provided into the cavity 216, and an electrical current is applied. The electrical contacts 206 act as the cathode for the process. In another embodiment, the seed layer 230 is used as the cathode for the galvanic process. The contact plate 218 is used as the anode during the galvanic process. As a result of the galvanic process, a copper layer 232 is formed that bonds the heat sink element 240 and the seed layer 230 together.

FIGS. 1A-1C show an embodiment with heat sink elements 102A-102D formed on a top side of a semiconductor substrate 116, and FIGS. 2A-2B show an embodiment with a heat sink element 240 formed on a bottom side of a semiconductor substrate 202. In another embodiment, these heat sink elements are combined in a single semiconductor substrate to provide heat sink elements on both the top side and bottom side of the substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a semiconductor substrate;
a first electrical contact formed on the semiconductor substrate; and
a first heat sink element bonded to the first electrical contact via a galvanic bond layer, wherein the first heat sink element directly contacts the first electrical contact at a first location, and wherein the galvanic bond layer fills in at least one gap of substantially varying height between the first electrical contact and the first heat sink element.

2. The integrated circuit of claim 1, wherein the first electrical contact is a top side contact that contacts a top side of the semiconductor substrate.

3. The integrated circuit of claim 1, wherein the first electrical contact is a bottom side contact that contacts a bottom side of the semiconductor substrate.

4. The integrated circuit of claim 1, wherein the first electrical contact and the first heat sink element comprise copper.

5. The integrated circuit of claim 1, wherein the galvanic bond layer comprises a copper layer that bonds the first electrical contact and the first heat sink element together.

6. The integrated circuit of claim 1, wherein the first heat sink element includes a bowed surface that directly contacts the first electrical contact at the first location.

7. The integrated circuit of claim 1, wherein the semiconductor substrate comprises a thinned semiconductor substrate.

8. The integrated circuit of claim 7, wherein the thinned semiconductor substrate is less than or equal to about 10 micrometers.

9. The integrated circuit of claim 1, wherein the first heat sink element comprises a thinned heat sink element.

10. The integrated circuit of claim 1, wherein the first heat sink element is positioned entirely inside of a cavity formed in a bottom side of the semiconductor substrate.

11. The integrated circuit of claim 1, wherein the first electrical contact and the first heat sink element are formed on a top side of the semiconductor substrate, and wherein the integrated circuit further comprises:
a second electrical contact formed on a bottom side of the semiconductor substrate; and
a second heat sink element bonded to the second electrical contact via a galvanic bond.

12. The integrated circuit of claim 11, and further comprising:
a third electrical contact formed on the top side of the semiconductor substrate; and
a third heat sink element bonded to the third electrical contact via a galvanic bond.

13. The integrated circuit of claim 1, wherein the integrated circuit comprises a vertical power transistor, and wherein the first electrical contact is a gate, source, or drain contact for the transistor.

14. The integrated circuit of claim 6, wherein the at least one gap increases in height with increasing distance from the first location.

15. A semiconductor device comprising:
a semiconductor substrate;
contact means formed on the substrate for making an electrical contact to the substrate;
means for dissipating heat from the semiconductor substrate; and
galvanically-deposited means for attaching the means for dissipating heat to the contact means, wherein the means for dissipating heat directly contacts the contact means at a first location, and wherein the galvanically-deposited means fills at least one gap of substantially varying height between the contact means and the means for dissipating heat.

* * * * *